United States Patent [19]

Bair et al.

[11] Patent Number: 4,978,712

[45] Date of Patent: Dec. 18, 1990

[54] METHOD FOR FABRICATING DEVICES INCLUDING POLYMERIC MATERIALS

[75] Inventors: Harvey E. Bair, Chester; Shiro Matsuoka, Basking Ridge, both of N.J.

[73] Assignee: AT&T Bell Laboratories, Murray Hill, N.J.

[21] Appl. No.: 324,491

[22] Filed: Mar. 16, 1989

[51] Int. Cl.$^5$ .................... C08G 59/00; C08G 73/10; C08G 85/00

[52] U.S. Cl. ..................... 525/51; 264/236; 264/272.13; 264/347; 525/482; 528/13; 526/60

[58] Field of Search ............. 526/60; 264/236, 272.13, 264/347; 528/103; 525/482, 51; 428/413, 473.5

[56] References Cited

U.S. PATENT DOCUMENTS

| | | | |
|---|---|---|---|
| 3,576,933 | 4/1971 | Bates et al. | 264/236 X |
| 3,991,258 | 11/1976 | Beckingham et al. | 526/61 X |
| 4,810,438 | 3/1989 | Webster et al. | 264/236 X |

OTHER PUBLICATIONS

Commercial use, See p. 2.

Gillham, J. K., "Cure and Properties of Thermosetting Systems," *Proc. 13th North American Thermal Analysis Soc. Conf.*, 9/23-26, 1984, Philadelphia, PA, pp. 344-347.

Bair, H. E., "Curing Behavior of an Epoxy Resin Above and Below Tg," *Polymer Preprints*, vol. 26, No. 1, Apr., 1985, pp. 10-11.

*Primary Examiner*—Earl Nielsen
*Attorney, Agent, or Firm*—G. Books

[57] ABSTRACT

A device fabrication method is disclosed in which a precursor polymeric or oligomeric material, capable of undergoing a curing reaction involving crosslinking and/or imidization, is at least partially cured and incorporated into the device being fabricated. Significantly, the at least partial curing is achieved by heating the material at generally increasing (although not necessarily continuously increasing) temperatures. In addition, the heat is supplied at a rate so that the temperature of the material is always maintained at or below the corresponding glass transition temperature of the material, which increases during the heating process.

7 Claims, 3 Drawing Sheets

METHOD FOR FABRICATING DEVICES INCLUDING POLYMERIC MATERIALS

BACKGROUND OF THE INVENTION

1. Field of the Invention

The invention pertains to device fabrication methods in which precursor polymeric or oligomeric materials undergo curing reactions involving crosslinking and/or imidization, to form solid, amorphous polymeric materials, as well as the resulting devices.

2. Art Background

Polymeric or oligomeric materials capable of undergoing crosslinking and/or imidization have many commercial applications. For example, a variety of thermosetting epoxies are used as adhesives because they, as well as the catalysts and/or curing agents used in conjunction with the epoxies, are commercially available in liquid form and are thus readily applied to device components which are to be adhered to one another. Upon being heated, a curing reaction is initiated in which epoxy molecules react with, i.e., undergo crosslinking with, the curing agent and/or other epoxy molecules, resulting in the formation of a solid, relatively rigid, amorphous polymeric material, which serves to bond the device components to one another. For example, among the most common of the thermosetting epoxies are the bisphenol A epoxies. When heated in the presence of, for example, a primary amine (a curing agent), a bisphenol A epoxy undergoes crosslinking with the amine, resulting in the formation of a more densely crosslinked polymeric material, i.e., a material containing aminoalcohols (the product of the crosslinking reaction), which material has a solid, relatively rigid, amorphous structure. Moreover, the continued addition of heat leads to crosslinking between aminoalcohol molecules, resulting in a new, even more rigid polymeric material.

Thermosetting epoxy novolac molding compounds are currently being used to form encapsulants for integrated circuits (ICs). In this regard, when encapsulating ICs, a solid pellet, containing a mixture of an epoxy novolac and a curing agent, such as a phenolic novolac, is typically initially heated in a dielectric heater to soften the pellet. Then, while soft, the pellet is transferred to a mold maintained at a relatively high temperature, from which the pellet material is extruded into cavities containing ICs, to encapsulate the ICs. Significantly, some curing of the pellet material, i.e., some crosslinking between the epoxy novolac and the curing agent, takes place within the dielectric heater and within the heated mold. However, the pellet generally spends too little time within the dielectric heater and heated mold to achieve an acceptable degree of cure. Consequently, further curing is achieved by heating the encapsulated ICs, for an additional period of time, within an oven maintained at the same temperature as the heated mold, resulting in the formation of more densely crosslinked, amorphous, polymeric encapsulant.

Polyimides, in the form of thin films, are now in use as insulators in semiconductor devices. Such a polyimide film is typically formed by dissolving a precursor polyamic acid in an organic solvent, which is deposited as a thin film onto a semiconductor device substrate using conventional spin deposition techniques. This film of polyamic acid-solvent solution is then heated to evaporate the solvent and to achieve imidization, resulting in a solid, amorphous, polyimide film.

As noted, the above curing reactions lead to the formation of solid, amorphous, polymeric materials. Because they have amorphous structures, these materials are, in fact, glasses, which are characterized by, among other things, glass transition temperatures, $T_g$. (In the present context, the glass transition temperature of a polymeric material is that temperature below which the material has a solid, amorphous structure, and above which the material has a soft, liquid-like or rubbery structure.)

A polymeric or oligomeric material capable of undergoing crosslinking and/or imidization is conventionally cured by being heated at a relatively high, constant temperature in order to achieve curing in a relatively short, commercially reasonable time period, e.g., several minutes to several hours. During this curing process, the $T_g$ of the material (which reflects the state of cure of the material) generally increases (as crosslinking and/or imidization proceeds) until it is equal, or almost equal, to the curing temperature. Significantly, because the curing temperature exceeds the $T_g$ of the material throughout most of the curing process, the material is necessarily in a soft, liquid-like or rubbery state during curing.

Until recently, it was believed that the $T_g$ of a conventionally cured, crosslinkable polymeric material could never exceed the cure temperature. (See, e.g., John K. Gillham, "Cure and Properties Of Thermosetting Systems," *Proc. 13th North American Thermal Analysis Soc. Conf.*, Sept. 23-26, 1984, Philadelphia, Pa., pp. 344-347.) This belief has now been disproved. That is, it has been determined that the $T_g$'s of conventionally cured, crosslinkable polymeric materials, having amorphous, glassy structures, continue to increase well beyond cure temperature when these glassy materials are isothermally aged, i.e., exposed to a constant temperature ambient, where the constant temperature is below the $T_g$ of the material. Such an ambient is, for example, a room temperature, or higher temperature, environment. (See H. E. Bair, "Curing Behavior Of An Epoxy Resin Above And Below $T_g$", edited by B. M. Culbertson, *ACS Polymer Preprints*, Vol. 26, No. 1, Apr. 1985, pp. 10-11.) In this regard, it is now believed that the mechanism, i.e., the rate of crosslinking, associated with conventional curing is primarily related to the concentrations of the reactants and the curing temperature. By contrast, it is now also believed that the mechanism associated with the additional curing achieved via isothermal aging is primarily related to the molecular configuration of the (partially) crosslinked polymeric material, i.e., the rate of additional crosslinking is related to the time scale over which molecular configurational rearrangements occur to allow reaction at crosslinkable sites. Significantly, as evidenced by the rate of increase of $T_g$, the rate of crosslinking associated with the additional curing of glassy, polymeric materials achieved via isothermal aging, hereafter termed configurational curing, is much lower than the rate of crosslinking achieved during conventional curing. In fact, the configurational curing rate at, for example, room temperature is so low that many thousands of hours are needed to achieve significant additional curing, which suggests that configurational curing is commercially impractical.

Although the curing rate achieved to date with configurational curing is impractically low, configurational curing has one advantage which conventional isothermal curing does not—the material undergoing curing remains relatively rigid. This is particularly advantageous in those instances where, for example, a first device component is to be adhered to a second device component with, for example, a thermosetting epoxy, after being aligned with a third device component. If the alignment is to be maintained, then the epoxy must necessarily remain rigid during curing.

As a consequence, those engaged in developing applications for polymeric or oligomeric materials capable of undergoing crosslinking and/or imidization have sought techniques for curing or further curing these materials, via configurational curing, in commercially reasonable periods of time.

SUMMARY OF THE INVENTION

The invention involves a technique for curing an uncured, or further curing a partially cured, polymeric or oligomeric material capable of undergoing crosslinking and/or imidization, via configurational curing, in a commercially reasonable period of time, e.g., 24 hours or 12 hours or less. By contrast with conventional curing techniques, and in accordance with the invention, curing or further curing is achieved by heating the material at generally increasing (although not necessarily continuously increasing) heating temperatures. Moreover, and also by contrast with conventional curing techniques, the heat is supplied at a rate so that the temperature of the material is always maintained at or below the corresponding glass transition temperature of the material $T_g$, which increases during the heating process.

In the case of, for example, the thermosetting epoxies and epoxy novolacs, as well as the polyamic acids and polyimides, it has been found that the temperatures of these materials can be increased at 8 degrees Centigrade (C.) per hour without exceeding their glass transition temperatures.

Significantly, very recently, it has further been found, in the case of the thermosetting epoxies and epoxy novolacs, as well as the polyamic acids and polyimides, that rates of temperature increase significantly in excess of 8 degrees C. per hour, e.g., about 12, about 18, about 24 or even about 48 degrees C. per hour, can be used without exceeding the glass transition temperatures of these materials. As a consequence, substantially increased throughput, i.e., throughput substantially greater than that achieved at 8 degrees C. per hour, is now readily achieved.

BRIEF DESCRIPTION OF THE DRAWING(S)

The invention is described with reference to the accompanying drawings, wherein.

DETAILED DESCRIPTION

Figure 1:
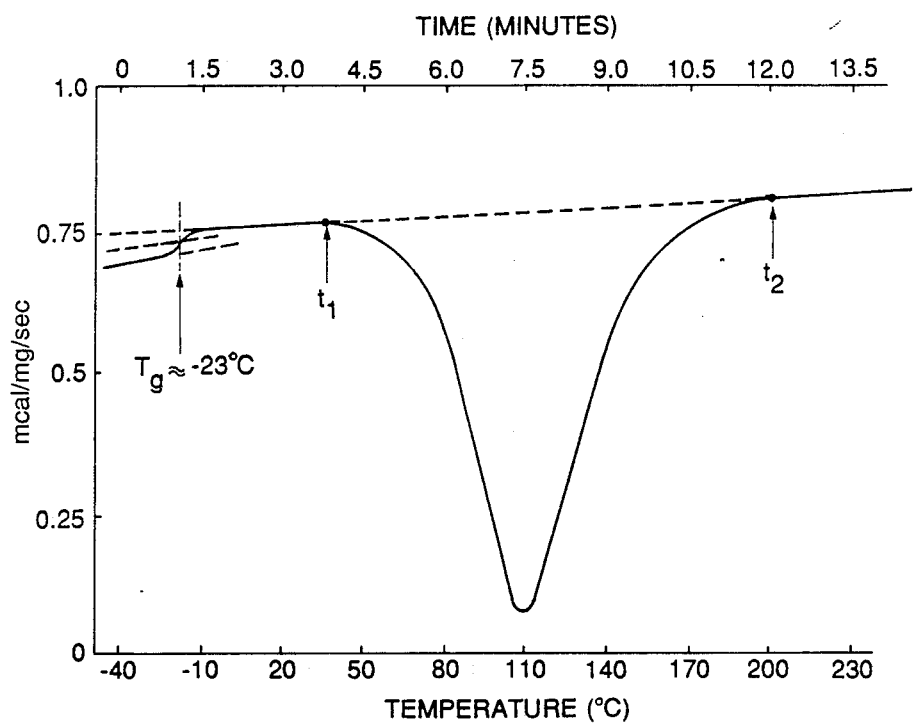
FIG. 1 is a plot of heat flow per unit mass versus time/temperature recorded during a thermal scan of an uncured sample of a thermosetting epoxy and an amine curing agent.

The invention involves a device fabrication method in which a precursor polymeric or oligomeric material capable of undergoing crosslinking and/or imidization is at least partially cured and incorporated into the device being fabricated. The invention also involves the resulting devices.

As discussed, a polymeric or oligomeric material capable of undergoing crosslinking and/or imidization is at least partially cured, in accordance with the invention, via a heating procedure in which heating temperature, and thus material temperature, is generally (although not necessarily continuously) increased. Moreover, heat is supplied at a rate so that the temperature of the material is always maintained at or below the corresponding glass transition temperature of the material, which increases during the heating.

Ideally, to implement the invention, the time course of the glass transition temperature, $T_g$, of the material throughout the inventive heating procedure should be known in advance. Stated alternatively, ideally, it should be known in advance whether a proposed heating schedule, i.e., a proposed heating temperature versus time schedule, will result in material temperature exceeding $T_g$. In general, at present, it is extremely difficult, if not impossible, to predict the time course of $T_g$ or the utility of a proposed heating schedule because $T_g$, at any instant in time, is dependent on both the nature, and the preceding thermal history, of the material. However, it has been found that the utility of a proposed heating schedule is readily determined, empirically, by subjecting a control sample of the material to be cured, together with the corresponding curing agent and/or catalyst, to the proposed heating schedule, and using a differential scanning calorimetric technique, described below, to determine whether material temperature has exceeded $T_g$.

The differential scanning calorimetric technique, employed here, is readily implemented using conventional, commercially available differential scanning calorimeters, such as the calorimeters sold by the Perkin-Elmer Company of Norwalk, Connecticut, under the trade names DSC-2C and DSC-7. These calorimeters typically include two cells, one of which remains empty and serves as a reference cell, and the other of which serves to contain the sample under consideration. The calorimeters also include temperature sensors which sense the temperatures of the reference and sample cells, as well as heaters, coolers and feedback control systems which serve to supply heat to, or withdraw heat from, the sample cell at a rate sufficient to null out any differences between the temperatures of the reference and sample cells.

In accordance with the differential scanning calorimetric technique, a sample is placed in the sample cell, and then thermally scanned, i.e., the temperature of the sample is increased at a specified, relatively high rate. For purposes of the present invention, the rate of temperature increase should be greater than or equal to about 10 degrees C. per minute but less than or equal to about 30 degrees C. per minute, and is preferably about 20 degrees C. per minute. The initial temperature of the sample, at the start of the thermal scan, should be below the (initial) glass transition temperature of the sample. Moreover, to ensure that the sample is (for all practical purposes) completely cured at the conclusion of the thermal scan, the duration of the thermal scan should be sufficiently long so that the sample reaches a temperature of at least 300 degrees C.

During the thermal scan, the heat flow needed to achieve temperature nulling, in units of, for example, millicalories per second (mcal/sec), as a function of time, is recorded and plotted. Because the rate of temperature increase is specified, this is equivalent to plotting heat flow as a function of sample temperature. In addition, because the mass of the sample is known or readily measured, the above plots are readily converted to plots of heat flow per unit mass of the sample, in units of, for example, millicalories per milligram per second (mcal/mg/sec), versus time and/or temperature. In this regard, as is known, the specific heat at constant pressure, $C_p$, of a sample is proportional to the above-described heat flow per unit mass (in the absence of non-equilibrium phenomena such as phase changes and chemical reactions). Consequently, the temperature dependence of $C_p$ of the sample is readily inferred.

Significantly, it is known, from theory, that the specific heats, $C_p$, of polymeric or oligomeric materials of the type considered here increase linearly with temperature, in the absence of structural transitions or chemical reactions. That is, it is known, theoretically, that prior and subsequent to a transition, the $C_p$ of a material of the type considered here should increase linearly with temperature. Similarly, it is known, theoretically, that prior and subsequent to a chemical reaction, such as a cross-linking or imidization reaction, the $C_p$ should also increase linearly.

In the case of an uncured sample of, for example, a thermosetting epoxy and an amine curing agent, a thermal scan of the sample at, for example, 20 degrees C. per minute yields a plot of heat flow per unit mass versus time/temperature typified by the plot in FIG. 1. As is evident, heat flow per unit mass initially increases essentially linearly with temperature, for temperatures above the starting temperature employed in the thermal scan. (The use of the term "essentially linearly" is meant to denote that the are small deviations from linearity due, for example, to noise in the detected signal and certain processes occurring in the sample during the thermal scan, not well understood, which precede transitions.) At about −23 degrees C., there is an almost step-like increase in heat flow per unit mass, followed by an essentially linear increase to a temperature of about 35 degrees C. This pattern indicates that the sample is initially solid and amorphous. At about −23 degrees C., the glass transition temperature, the sample undergoes a transition from a glass to a soft, rubbery structure, which remains unchanged until about 35 degrees C.

For the sake of definiteness and convenience, the glass transition temperature, $T_g$, of a sample is hereafter defined with reference to the sample's thermal scan. That is, $T_g$ is defined by initially approximating the essentially linear portion of the plot of heat flow per unit mass versus temperature preceding the transition by a least-squares-fit linear approximation, and then extrapolating this linear approximation to the right (see FIG. 1). In addition, the essentially linear portion of the plot subsequent to the transition is similarly linearly approximated, and this second linear approximation is extrapolated to the left. Two points, intermediate to the extrapolated linear curves, are used to define a straight line which is extended through the scan plot. The intersection of this straight line with the scan plot then defines $T_g$.

With reference again to FIG. 1, it is evident that there is a very large deviation from linearity in the curve of heat flow per unit mass versus time/temperature over the temperature range extending from about 35 degrees C. to about 200 degrees C., with the curve once again assuming an essentially linear character above about 200 degrees C. This large deviation is exothermic in nature, i.e., the calorimeter is withdrawing heat from the sample. This heat is just the heat being evolved by the sample as the epoxy of the sample undergoes crosslinking with the curing agent. In this regard, an approximation to the heat of reaction per unit mass of the sample, $H_R$, associated with complete curing of the sample, is readily obtained from the curve of heat flow per unit mass versus time in FIG. 1. That is, $H_R$ is approximated by identifying the point in time, labeled $t_1$ in FIG. 1, beyond the transition, where the curve initially deviates from linearity. Similarly, the point in time where the curve resumes its linear behavior, labeled $t_2$ in FIG. 1, is also identified. Then, by drawing a straight line from $t_1$ to $t_2$, $H_R$ is approximated by measuring the area bounded by this straight line and the curve of heat flow per unit mass versus time.

Figure 2:
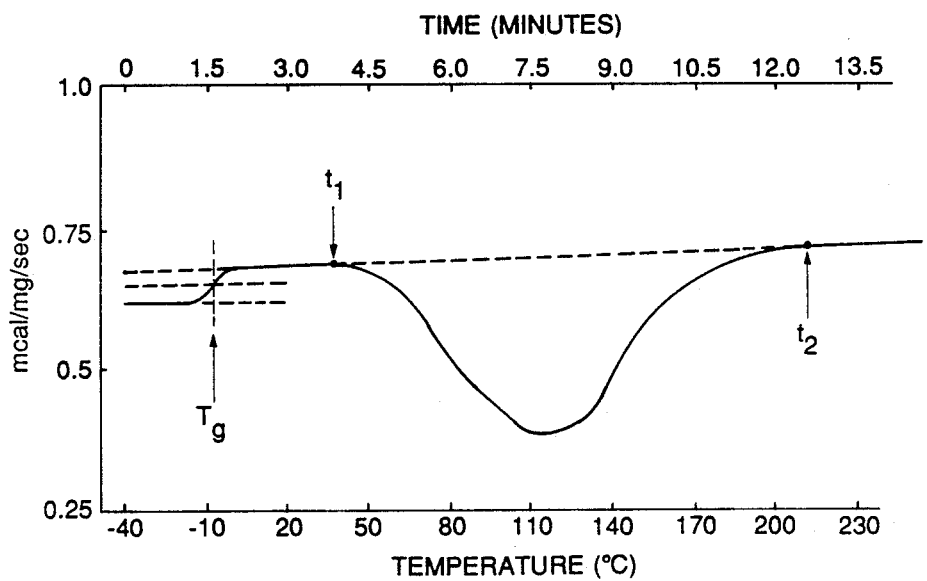
FIG. 2 is a plot of heat flow per unit mass versus time/temperature recorded during a thermal scan of a sample of a thermosetting epoxy and an amine curing agent, which sample was conventionally partially cured.

If an uncured sample, of the type described above, were to be partially cured using conventional, isothermal curing, and thermally scanned at, for example, 20 degrees C. per minute, then the resulting plot of heat flow per unit mass versus time/temperature can be expected to look like the plot in FIG. 2. A comparison of the plots in FIGS. 1 and 2 shows, among other things, that $T_g$ has increased, as expected. In addition, the area bounded by the straight line extending from $t_1$ to $t_2$ and the plot of heat flow per unit mass versus time is smaller than $H_R$. This reduced area approximates the residual heat per unit mass, $H_r$, associated with the partially cured sample, i.e., the additional heat per unit mass which is evolved by the initially partially cured sample in achieving a state of complete cure.

Figure 3:
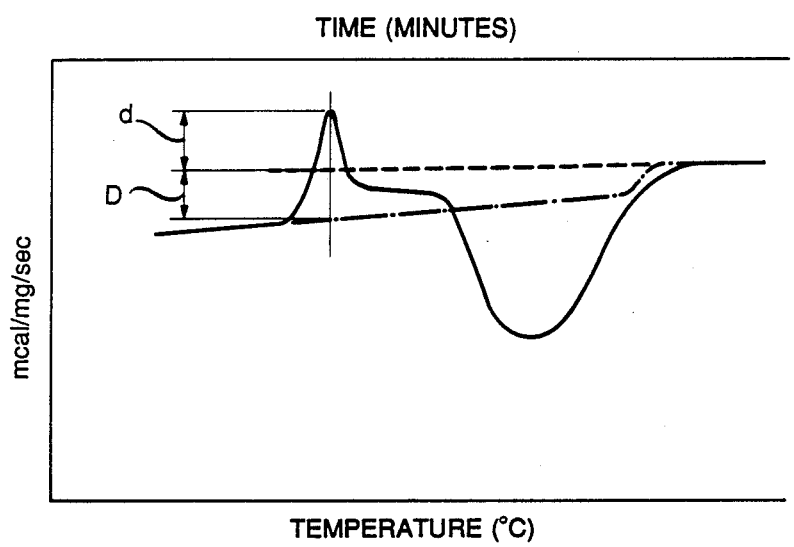
FIG. 3 depicts, qualitatively, the features typical of plots of heat flow per unit mass versus time/temperature recorded during thermal scans of samples partially cured using the inventive curing procedure.

It has been found that when an uncured sample is at least partially cured, or a conventionally, partially cured sample is further cured, via a heating procedure in which sample temperature does not exceed $T_g$, and the resulting sample is thermally scanned, as described above, then the resulting plot of heat flow per unit mass versus time/temperature has a feature which readily distinguishes the sample from conventionally cured samples (with the exceptions noted below). That is, as depicted in FIG. 3 (which depicts a scan plot corresponding to a partially cured sample), in the vicinity of the temperature corresponding to $T_g$, rather than exhibiting an almost step-like increase in heat flow, the plot exhibits an overshoot in heat flow near $T_g$. Significantly, for a fixed scan rate, the lower the rate of temperature increase employed during curing, the higher the overshoot, and vice versa.

If a relatively high rate of temperature increase is employed during curing, then the amplitude of the overshoot in the scan plot will be relatively small and, in fact, the presence of this overshoot (if it exists) may be difficult to detect. This difficulty is readily overcome by subjecting the sample to a second, identical thermal scan, the results of which are depicted by the dot-dash line in FIG. 3. This second scan serves to eliminate the thermal memory of the sample, i.e., the second scan plot contains no overshoot. In addition, because the first thermal scan serves, among other things, to essentially fully cure the sample, the almost step-like increase in heat flow contained in the second scan plot, corresponding to the $T_g$ of the now essentially fully cured sample, is positioned to the right of the overshoot (because $T_g$ has increased), as viewed in FIG. 3. Moreover, the second scan plot is free of any exothermic deviation from linearity.

The presence of an overshoot in the first scan plot is confirmed, for purposes of the invention, by carrying out the following procedure. First, approximate the essentially linear portion of the second scan plot subsequent to the almost step-like increase in heat flow by a least-squares-fit linear approximation (hereafter termed the first linear approximation), which is then extrapolated to the left, as viewed in FIG. 3, across the first scan plot. Similarly, approximate the essentially linear portion of the second scan plot preceding the almost step-like increase in heat flow by a lest-squares-fit linear approximation (hereafter termed the second linear approximation), which is extrapolated to the right, as viewed in FIG. 3, across the first scan plot. The peak of the purported overshoot is identified, as are the corresponding points in the first and second linear approximations. The difference between the amplitudes of the two points in the two linear approximations is then measured. (As depicted in FIG. 3, for purposes of identification, this difference is hereafter denominated D.) In addition, the difference between the amplitudes of the peak in the purported overshoot and the corresponding point in the first linear approximation is also measured. (As depicted in FIG. 3, for purposes of identification, this latter difference is hereafter denominated d.) A purported overshoot exists, for purposes of the invention, provided $$\beta = \frac{D + d}{D} \geq 1.08.$$

Figure 4:
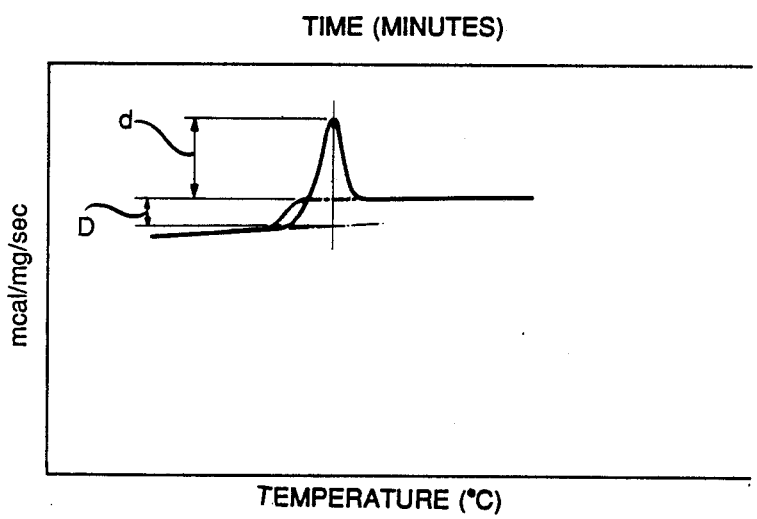
FIG. 4 depicts, qualitatively, the features typical of plots of heat flow per unit mass versus time/temperature recorded during thermal scans of samples essentially fully cured using the inventive curing procedure.

If the sample under consideration was initially essentially fully cured, then the procedure for confirming the presence of an overshoot is as described above, and as depicted in FIG. 4. The only difference between the scan plot depicted in FIG. 4 and that depicted in FIG. 3 is the fact that the almost step-like increase in heat flow in FIG. 4 is closely vertically aligned with the overshoot because the first thermal scan produces no additional curing of the (initially essentially fully cured) sample, and thus no increase in $T_g$.

In summary, samples which have been cured, or further cured, using heating schedules in which material temperature does not exceed $T_g$, exhibit overshoots in their scan plots. On the other hand, no such overshoots are seen in the scan plots associated with samples cured using heating schedules in which material temperature exceeds $T_g$. Consequently, the utility of a proposed heating schedule is determined, empirically, in accordance with the invention, by subjecting a control sample of the material of interest to the proposed schedule. Then the control sample is thermally scanned. The utility of the proposed heating schedule is then determined on the basis of the presence or absence of an overshoot in the resulting scan plot.

By using the above-described empirical procedure, it was initially found, in the case of the thermosetting epoxies and epoxy novolacs, the polyamic acids and the polyimides, that a heating schedule with a rate of temperature increase equal to about 8 degrees C. per hour is useful, i.e., this heating schedule does not result in material temperature exceeding $T_g$ (the scan plots contain overshoots). Very recently, it has been found that heating schedules with rates of temperature increase equal to about 12, about 18, and 24 and even as high as about 48 degrees C. per hour are useful. Moreover, it has also recently been found that heating schedules with rates of temperature increase greater than about 48 degrees C. per hour are not useful, i.e., such heating schedules result in material temperature exceeding $T_g$ (there are no overshoots in the scan plots).

Just as the differential scanning calorimetric procedure, described above, is useful in determining the utility of a proposed heating schedule, this same procedure is also useful in distinguishing between materials which have been cured in accordance with the invention and those which have been conventionally cured (with the exceptions noted below). That is, when thermally scanned, the former exhibit overshoots in their scan plots, whereas the latter do not.

Significantly, the differential scanning calorimetric technique is also useful in determining, quantitatively, the rate of temperature increase employed during the curing of a polymeric or oligomeric material, provided the material was cured in accordance with the invention. That is, as noted above, if the material was cured in accordance with the invention, then the lower the rate of temperature increase employed during curing, the higher the overshoot in the corresponding thermal scan plot, and vice versa. However, this is merely a qualitative relationship between height of overshoot and rate of temperature increase because overshoot height is also affected by the scan rate. In this regard, it has been found that the parameter $\beta$, defined above, provides a measure of the rate of temperature increase employed during curing which is independent of scan rate. Moreover, $\beta$ decreases as one increases the rate of temperature increase. For example, in the case of thermosetting epoxies, it has been found that a rate of temperature increase equal to about 8 degrees C. per hour corresponds to a $\beta$ of about 1.87. Similarly, rates of temperature increase equal to about 12, about 18, about 24 and about 48 degrees C. per hour correspond to $\beta$'s equal to, respectively, about 1.64, about 1.60, about 1.55 and about 1.12.

It should be noted that the presence or absence of an overshoot in a scan plot can, in some instances, be misleading. For example, if a material was initially cured in accordance with the invention, and subsequently mechanically deformed, then the overshoot in the scan plot will be either reduced in amplitude or eliminated. Similarly, if, after curing, the material was heated at a temperature greater than $T_g$ for even a few minutes, then the overshoot in the scan plot will also be eliminated. Of course, such heating will necessarily result in the cured material becoming soft or rubbery, which, for many applications, is undesirable. On the other hand, if a material is, for example, conventionally partially cured and subsequently isothermally aged at a temperature below $T_g$, then the resulting scan plot will contain an overshoot.

The above-described procedure for determining the utility of a proposed heating schedule is to be used, in accordance with the invention, in fabricating a device. That is, in accordance with the invention, a device is fabricated by contacting at least a portion of a component of the device with a material region including polymeric or oligomeric material capable of undergoing crosslinking and/or imidization. The material region is at least partially cured, using the inventive curing procedure. At least a portion of the at least partially cured material is then incorporated into the device, and the device is completed using, for example, conventional techniques. For example, if a first device component is to be adhered to a second device component using a thermosetting epoxy, then the epoxy and corresponding catalyst and/or curing agent are applied, in liquid form, to the device components, heated in accordance with the invention to achieve at least partial curing, and incorporated into the device. Similarly, if a thermosetting epoxy novolac and a corresponding curing agent are to be used to encapsulate ICs, then conventional procedures are initially employed. However, after encapsulation, rather than further curing the IC encapsulant isothermally, as is conventional, the encapsulant is further cured using the inventive curing procedure. As yet another example, if a semiconductor device, employing a thin film of polyimide, is to be fabricated, then a polyamic acid-solvent solution is spin-deposited onto the device substrate, using conventional techniques. However, to evaporate the solvent and to achieve imidization, the solution is heated in accordance with the inventive procedure.

As a pedagogic aid to a more complete understanding of the invention, the application of the inventive device fabrication method to the fabrication of a package which includes a semiconductor laser-optical fiber unit is described below. The fabrication of the package, and particularly of the unit, is instructive because it involves the use of both a thermosetting epoxy adhesive and the inventive curing technique for adhering the optical fiber to a component of the unit while maintaining the fiber in alignment with the semiconductor laser.

Figure 5:
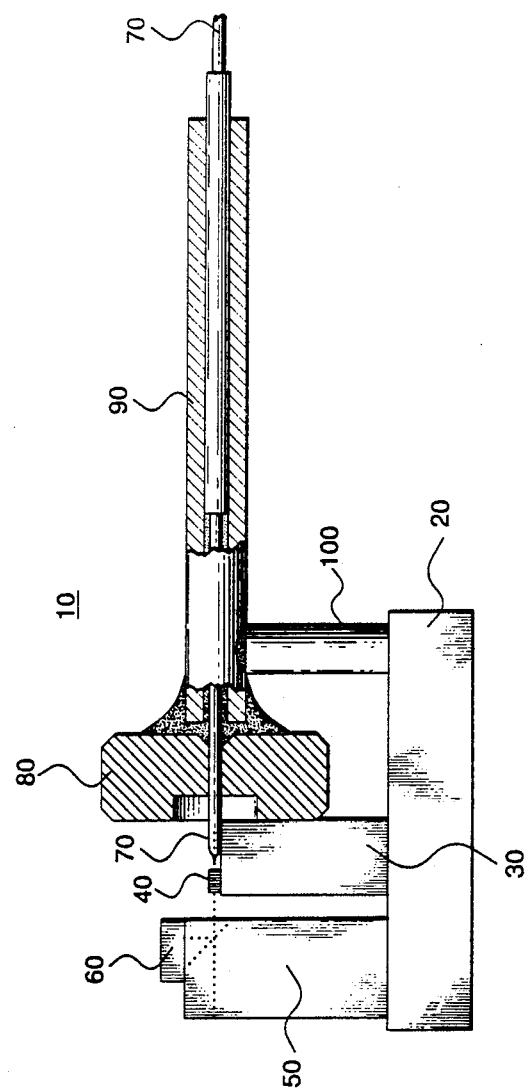
FIG. 5 is a side view of a semiconductor laser-optical fiber unit which is advantageously manufactured using the inventive curing procedure.

With reference to FIG. 5, the semiconductor laser-optical fiber unit 10, of interest here, includes a base 20. The unit also includes a laser submount 30 supporting a semiconductor laser 40, such as a gallium arsenide laser, and a backface monitor submount 50 supporting a PIN diode photodetector 60. (The photodetector 60 serves to detect light emitted by the semiconductor laser 40.) The unit further includes an optical fiber 70 extending through both a ferrule 80 and a sleeve 90, the sleeve being supported by a sleeve submount 100. The base 20 and submount 30 are, for example, of beryllium oxide, while the submounts 50 and 100 are, for example, of aluminum oxide. In addition, the sleeve 90 is formed from, for example, a combination of iron, nickel and cobalt sold under the tradename Kovar, while the ferrule 80 is, for example, of sapphire.

In manufacturing the unit 10, a thermosetting epoxy, such as a bisphenol -A- diglycidyl ether, and a curing agent, such as an amine adduct of the bisphenol -A- diglycidyl ether, is applied to the upper surface of the base 20. The submount 30 supporting the laser 40, the submount 50 supporting the photodetector 60 and the submount 100 are placed on the upper surface of the base 20. This combination of components is then heated at 90 degrees C., for about 10 minutes, to partially cure the epoxy, i.e., to produce some crosslinking between the epoxy and the curing agent, and thus adhere the submounts to the base. Further curing is achieved by heating the combination, in an oven, at 105 degrees C. for about 1 hour.

With its length encircled by the ferrule 80 and sleeve 90, the tip of the optical fiber, which protrudes from the ferrule, is brought close to the semiconductor laser, and actively aligned with the laser. That is, with the laser operating, the tip of the optical fiber is moved while the amount of light emanating from the distal end of the fiber is monitored, until a desired fiber-to-laser aligment is achieved.

Significantly, during the active alignment process, the unit 10 is heated at 60 degrees C., the highest temperature at which the gallium arsenide laser will operate. In addition, the epoxy and curing agent, described above, are applied, in liquid form, to the interfaces between the ferrule 80 and laser submount 30, between the ferrule 80 and sleeve 90 and between the sleeve 90 and sleeve submount 100. Some of the epoxy and curing agent also flow into the annular space between the optical fiber 70 and sleeve 90. Because the epoxy and curing agent are being heated, some crosslinking does take place and, consequently, the epoxy/curing agent mixture becomes solid and relatively rigid after about ten minutes. As a result, the various unit components to which the epoxy/curing agent were applied also become relatively rigidly adhered to one another after about ten minutes. Because the active alignment process is usually completed in less than ten minutes, the components are adhered to one another in positions which maintain the desired fiber-to-laser alignment.

The curing of the adhesive which occurs during active alignment is inadequate. To achieve and adequate degree of curing, the unit 10 is initially heated for about 1 hour at 60 degrees C. This temperature is below the $T_g$ of the partially cured adhesive, and thus the adhesive remains solid and the fiber-to-laser alignment is maintained. To achieve still further curing, while maintaining the desired alignment, the unit 10 is heated in accordance with the inventive curing procedure. That is, the unit 10 is, for example, placed within an oven. The initial temperature within the oven should be below the (current) $T_g$ of the partially cured adhesive, e.g., 40 degrees C. The oven temperature is then increased at, for example, 8 degrees C. per hour, until a temperature of at least 105 degrees C. is achieved.

After the adhesive is cured, as described above, the unit 10 is mounted within the interior of a ceramic package, with the sleeve 90 (containing the optical fiber 70) protruding through an aperture in the sidewall of the package. A useful ceramic package is of the type described in U.S. application Ser. No. 008,051 filed by N. R. Dietrich et al on Jan. 15, 1987, which is hereby incorporated by reference.

We claim:

1. A method for fabricating a device which includes at least one device component, comprising the steps of:
    at least partially curing a material region including polymeric or oligomeric material capable of undergoing crosslinking and/or imidization, which material region contacts at least a portion of said device component;
    incorporating at least a portion of the at least partially cured material into said device; and
    completing the fabrication of said device, characterized in that
    said curing step includes the step of heating said material region at, at least, first and second heating temperatures, said second heating temperature being greater than said first heating temperature, said material exhibiting glass transition temperatures corresponding to the states of cure of said material during said heating, the rate at which heat is supplied to said material during said heating being chosen in relation to said material so that the temperatures of said material during said heating are less than, or equal to, the corresponding glass transition temperatures of said material, and if said material is capable of undergoing crosslinking, then heat is supplied at a rate such that a rate of increase of temperature of said material is greater than about 12 degrees C. per hour during at least a portion of said heating.

2. The method of claim 1 wherein, if said material is capable of undergoing imidization, then said heat is supplied at a rate such that a rate of increase of temperature of said material is greater than or equal to about 12 degrees C. per hour during at least a portion of said heating.

3. The method of claim 2, wherein said rate of temperature increase is greater than or equal to about 18 degrees C. per hour.

4. The method of claim 1, wherein said material has a composition which includes a thermosetting epoxy compound.

5. The method of claim 1, wherein said material has a composition which includes a thermosetting epoxy novolac compound.

6. The method of claim 1, wherein said material has a composition which includes a polyamic acid.

7. The method of claim 1, wherein said material has a composition which includes a polyimide compound.

* * * * *